(12) United States Patent
Hayakawa et al.

(10) Patent No.: US 8,736,364 B2
(45) Date of Patent: May 27, 2014

(54) POWER AMPLIFIER AND METHOD OF OPERATION THEREOF

(75) Inventors: Makoto Hayakawa, Tokyo (JP); Kazumi Shiikuma, Tokyo (JP)

(73) Assignee: NEC Corporation, Tokyo (JP)

( * ) Notice: Subject to any disclaimer, the term of this patent is extended or adjusted under 35 U.S.C. 154(b) by 57 days.

(21) Appl. No.: 13/500,723

(22) PCT Filed: Sep. 27, 2010

(86) PCT No.: PCT/JP2010/067298
§ 371 (c)(1),
(2), (4) Date: Apr. 6, 2012

(87) PCT Pub. No.: WO2011/046031
PCT Pub. Date: Apr. 21, 2011

(65) Prior Publication Data
US 2012/0200353 A1    Aug. 9, 2012

(30) Foreign Application Priority Data
Oct. 13, 2009  (JP) .................................. 2009-235926

(51) Int. Cl.
*H03F 3/68* (2006.01)
(52) U.S. Cl.
USPC ...................................... 330/124 R; 330/310
(58) Field of Classification Search
USPC .................. 330/53, 84, 124 R, 286, 295, 310
See application file for complete search history.

(56) References Cited

U.S. PATENT DOCUMENTS

| 5,886,575 A | * | 3/1999 | Long ............................ 330/129 |
| 7,193,473 B2 | | 3/2007 | Pengelly et al. |
| 7,821,337 B2 | * | 10/2010 | Yamanouchi et al. ........ 330/149 |
| 2006/0214732 A1 | | 9/2006 | Pengelly et al. |
| 2009/0206926 A1 | | 8/2009 | Horiguchi et al. |
| 2009/0261901 A1 | * | 10/2009 | Meharry .................. 330/124 R |
| 2010/0033242 A1 | * | 2/2010 | Krishnamurthy et al. 330/124 R |

FOREIGN PATENT DOCUMENTS

| JP | 2001-518731 | 10/2001 |
| JP | 2006-166141 | 6/2006 |
| JP | 2007-081800 | 3/2007 |
| JP | 2008-535321 | 8/2008 |
| WO | WO 2007/015462 | 2/2007 |
| WO | WO 2008/053534 | 5/2008 |

OTHER PUBLICATIONS

Cripps, "RF Power Amplifiers for Wireless Communications", Artech House Microwave Library, Apr. 1999.
International Search Report, PCT/JP2010/067298, Nov. 9, 2010.

* cited by examiner

*Primary Examiner* — Khanh V Nguyen
(74) *Attorney, Agent, or Firm* — Young & Thompson

(57) ABSTRACT

A power amplifier is provided which is capable of performing efficient amplification in a wider transmission signal power range than conventional power amplifiers. The power amplifier for amplifying and outputting an input signal includes first to N-th amplifiers (N is an integer of two or more) which are cascaded. A Doherty amplifier is used in circuit configuration of each of the first to N-th amplifiers. At least one of the first to (N−1)-th amplifiers has a different power ratio from that of the N-th amplifier.

9 Claims, 11 Drawing Sheets

POWER AMPLIFIER AND METHOD OF OPERATION THEREOF

TECHNICAL FIELD

This invention relates to a power amplifier, and in particular to a power amplifier for use in mobile phone base stations or the like, and a method of operating such a power amplifier.

BACKGROUND ART

There is an increasing demand for reduction of power consumption (improvement in power efficiency) of power amplifiers for use in mobile phone base stations or the like. This is because the reduction in power consumption obviously provides an effect of saving electricity costs and reduction in energy consumption provides an effect of reducing environmental load. Not only these effects, the amount of heat generated by the power amplifier can also be reduced, which enables reduction of surface area of a radiator plate required for dissipation of heat, and hence reduction of volume of the power amplifier.

In order to improve the efficiency of power amplifiers, Doherty amplifiers are commonly used (see, for example, JP-A-2006-166141 (Patent Document 1)). A Doherty amplifier comprises a carrier amplifier which constantly performs signal amplification operation, and a peak amplifier which operates only during high power output. The Doherty amplifier is configured to divide an input signal into the carrier amplifier and the peak amplifier, and to combine outputs of the carrier amplifier and peak amplifier (see, for example, JP-T-2008-535321 (Patent Document 2)).

FIG. 1 is a block diagram illustrating a configuration of a common Doherty amplifier. The Doherty amplifier comprises a carrier amplifier 1, a peak amplifier 2, an input power divider circuit 3, and an output power combiner circuit 4. Each of the carrier amplifier 1 and the peak amplifier 2 includes a field-effect transistor (FET) or the like.

FIG. 2 is a block diagram illustrating an example of a configuration of the carrier amplifier 1 or the peak amplifier 2 when a FET is used. The carrier amplifier 1 (or the peak amplifier 2) comprises a FET 5, a DC coupling capacitor 6, an input matching circuit 7, an output matching circuit 8, a RF choke coil 9, a by-pass capacitor 10, a DC power supply 11, and so on.

In general, the carrier amplifier 1 is biased to class AB or class B, while the peak amplifier 2 is biased to class C. By providing the carrier amplifier 1 operating near a saturation output power level while maintaining the saturation, a higher efficiency than normal class-A or class-AB amplifiers can be realized even during output with a back-off from the saturation output power.

FIG. 3 is a diagram illustrating efficiency characteristics versus output power of a power amplifier employing the Doherty amplifier configuration shown in FIG. 1. In FIG. 3, the horizontal axis represents output signal power, while the vertical axis represents efficiency. The efficiency can be represented by the following equation.

Efficiency=(output signal power/applied DC power)×100[%]

It is assumed here that the carrier amplifier 1 and the peak amplifier 2 have the same saturation output level. In this case, the power amplifier exhibits efficiency peaks, with respect to the combined saturation power of the carrier amplifier 1 and the peak amplifier 2, at the 6 dB back-off point (peak point on the left side (lower output power side) in FIG. 3) where the output of the carrier amplifier 1 is saturated, and at the 0 dB back-off point (peak point on the right side (higher output power side) in FIG. 3) where the output of the peak amplifier 2 is also saturated.

Herein, a Doherty amplifier, in which devices having the same saturation output level are used as the carrier amplifier 1 and peak amplifier 2, and which exhibits efficiency peaks at the 0 dB back-off point (the peak point on the right side (lower output power side) in FIG. 3) and at the 6 dB back-off point (the peak point on the left side (higher output power) in FIG. 3) from saturation power, shall be referred to as the "symmetric Doherty amplifier".

When the saturation output level of the carrier amplifier 1 is denoted by X [W], and the saturation output level of the peak amplifier 2 is denoted by Y [W], (X/Y) is called power ratio. Therefore, the "symmetric Doherty amplifier" has a power ratio (X/Y) that is constantly equal to one. However, it is usually impossible in an actual circuit that the power ratio (X/Y) is exactly one. Accordingly, it can be said that the power ratio (X/Y) of the "symmetric Doherty amplifier" is substantially equal to one.

Further, a technique is also commonly known in which highly efficient operation of a Doherty amplifier is made possible at an arbitrary operating point by forming the carrier amplifier 1 and the peak amplifier 2 by devices having different saturation output levels so as to vary the peak point (see "RF POWER AMPLIFIERS FOR WIRELESS COMMUNICATIONS", Steve C. Cripps, ARTECH HOUSE MICROWAVE LIBRARY, April, 1999). Such a Doherty amplifier shall be herein referred to as the "asymmetric Doherty amplifier".

The "asymmetric Doherty amplifier" has a power ratio (X/Y) that is not equal to one.

FIG. 4 is a diagram illustrating comparison of efficiency characteristics versus output power between the symmetric Doherty amplifier and the asymmetric Doherty amplifier. In FIG. 4, the asymmetric Doherty amplifier is illustrated by way of example as having an efficiency peak at a back-off point greater than 6 dB (peak point on the left side (lower output power side) of the dashed line in FIG. 4) on the assumption that [saturation output level Y of the peak amplifier 2]>[saturation output level X of the carrier amplifier 1]. For example, when a device having a saturation output level Y of 90 W is used as the peak amplifier 2 while a device having a saturation output level X of 30 W is used as the carrier amplifier 1 so that the power ratio (X/Y) is (1/3), the asymmetric Doherty amplifier will have an efficiency peak at 12 dB back-off point.

JP-A-2007-081800 (Patent Document 3) discloses an example of an asymmetric Doherty amplifier configuration in which semiconductor devices having the same or different saturation output levels are used as a carrier amplifier and a peak amplifier, and different supply voltages are respectively supplied to the carrier amplifier and the peak amplifier so that they have different saturation output levels.

In power amplifiers, in general, a necessary number of amplifiers are cascaded in order to satisfy a gain requirement.

FIG. 5 is a block diagram showing an example of such a power amplifier 20'. The illustrated power amplifier 20' has a configuration in which a driver stage amplifier 13' is cascaded to a final stage amplifier 14 that is configured as the aforementioned Doherty amplifier. In comparison with the final stage amplifier 14, the driver stage amplifier 13' has a lower output power level and hence has lower power consumption. Therefore, the driver stage amplifier 13' is usually formed by a class-A or class-AB amplifier 12 having a simple circuit configuration.

FIG. 6 is a graph in which efficiency characteristics are plotted against output power for the driver stage amplifier 13', the final stage amplifier 14, and the power amplifier 20'. Since the Doherty amplifier configuration is not used for the driver stage amplifier 13', the relationship of its output signal power versus efficiency characteristics is represented by a straight line as shown by the two-dot-chain line in the graph. The relationship of output signal power versus efficiency characteristics of the final stage amplifier 14 that is a Doherty amplifier (represented by the dashed line in the graph) is added to this linear relationship, whereby the relationship of output signal power versus efficiency characteristics of the power amplifier 20' can be obtained as represented by the solid line.

On the other hand, a mobile communications system is a system in which an amount of communication traffic varies depending on time and location. One of such mobile communications systems is a W-CDMA (Wideband Code Division Multiple Access) modulation wave system.

The W-CDMA modulation wave system, having a large amount of communication traffic, is sometimes operated with four carriers as shown in FIG. 7A, whereas it is sometimes operated with a single carrier as shown in FIG. 7B especially when the amount of communication traffic is small such as during night time.

In the W-CDMA modulation wave system, a signal power level of each carrier also varies from moment to moment. For example, when the system has a constant power level per carrier, a difference in signal power level is as great as 6 dB between when the system is operated with four carriers and when operated with a single carrier. It is assumed that the system is designed by using a circuit configuration of a Doherty amplifier such that a maximum efficiency is obtained when the system is operated with four carriers. In this case as well, the power amplifier cannot be operated at a high efficiency when the system is operated with a single carrier, that is, when the signal power level is lower by 6 dB than when the system is operated with four carriers.

Therefore, in the field of power amplifiers for use in a system in which transmission power varies depending on a magnitude of amount of communication traffic, it is desired to develop a power amplifier capable of operating at higher efficiency than conventional ones both in a high transmission power level region and in a low transmission power level region.

As mentioned in the above, a circuit configuration of a Doherty amplifier is employed for enhancing the efficiency of power amplifiers. In a typical Doherty amplifier configuration, the maximum peak of efficiency is found at the back-off points of 0 dB and 6 dB from the saturation output power level. The technique has also been established in which devices having different saturation output levels are used as a carrier amplifier and a peak amplifier so that the Doherty amplifier is enabled to operate to exhibit its maximum efficiency point at a desired operating point by changing the efficiency peak point of the Doherty amplifier from 6 dB. When this technique is applied to a power amplifier which amplifies a modulation signal having a peak factor as large as 7 dB to 11 dB such as W-CDMA modulated waves or OFDMA (Orthogonal Frequency Division Multiple Access) modulated waves, it is effective in realization of high efficiency operation that the power amplifier is designed so as to exhibit its maximum efficiency at a back-off point of 7 dB to 11 dB that is the operating point thereof.

On the other hand, in a power amplifier for use in mobile phone base stations, the transmission signal power level varies from moment to moment depending on a magnitude of communication traffic or the like. A power amplifier is typically designed to exhibit its maximum efficiency during maximum power transmission. However, in this case, the efficiency of the power amplifier is decreased during transmission at a low transmission signal power level.

Thus, under the circumstances there is an increasing demand for reduction of power consumption, it is desired to realize a power amplifier which is capable of operating at higher efficiency and lower power consumption than conventional ones both in a high transmission signal power level region and in a low transmission signal power level region, without depending on the transmission signal power level determined based on a magnitude of communication traffic or the like.

There are known prior art documents relating to this invention. For example, JP-T-2001-518731 (Patent Document 4) discloses an amplifier circuit including a first Doherty amplifier, and a second Doherty amplifier which is cascaded to the first Doherty amplifier.

As described above, there is a demand for realization of a power amplifier capable operating at higher efficiency and lower power consumption than conventional ones both in a high transmission signal power level region and in a low transmission signal power level region without depending on the transmission signal power level determined based on a magnitude of communication traffic or the like.

The aforementioned Patent Document 4 proposes to cascaded two Doherty amplifiers in order to enable the power amplifier to operate efficiently in a wide dynamic range. However, the range of transmission signal power in which the power amplifier is able to operate efficiently cannot be enlarged unless amplification characteristics obtained by the Doherty amplifiers are taken into consideration. Thus, the conventional power amplifiers have a problem that it is difficult to improve the amplification efficiency in a wide transmission signal power range.

SUMMARY OF THE INVENTION

It is an object of this invention to provide a power amplifier capable of performing efficient amplification in a wider transmission signal power range than conventional power amplifiers, and a method of operating such a power amplifier.

The power amplifier according to the invention is a power amplifier for amplifying and outputting an input signal, and is characterized in that: the power amplifier includes first to N-th amplifiers (N is an integer of two or more) which are cascaded; a Doherty amplifier is used in circuit configuration of each of the first to N-th amplifiers; and at least one of the first to (N−1)-th amplifiers has a different power ratio from that of the N-th amplifier.

The power amplifier according to this invention is capable of performing efficient amplification operation in a wider transmission signal power range than conventional ones.

MODE FOR CARRYING OUT THE INVENTION

Exemplary embodiments of this invention will be described with reference to the drawings.

A power amplifier according to a first exemplary aspect of the invention is a power amplifier for amplifying and outputting an input signal. This power amplifier includes first to N-th amplifiers (N is an integer of two or more) which are cascaded. Each of the first to N-th amplifiers is formed by a Doherty amplifier. In the power amplifier according to the first exemplary aspect of this invention, at least one of the first to (N−1)-th amplifiers has a power ratio different from that of the N-th amplifier.

The following description of exemplary embodiments of the invention will be principally made in terms of an example in which N is equal to two. This means that the power amplifier is composed of a first and a second amplifier which are cascaded. In this type of configuration the first amplifier is referred to as the driver stage amplifier, and the second amplifier is referred to as the final stage amplifier.

Figure 8:
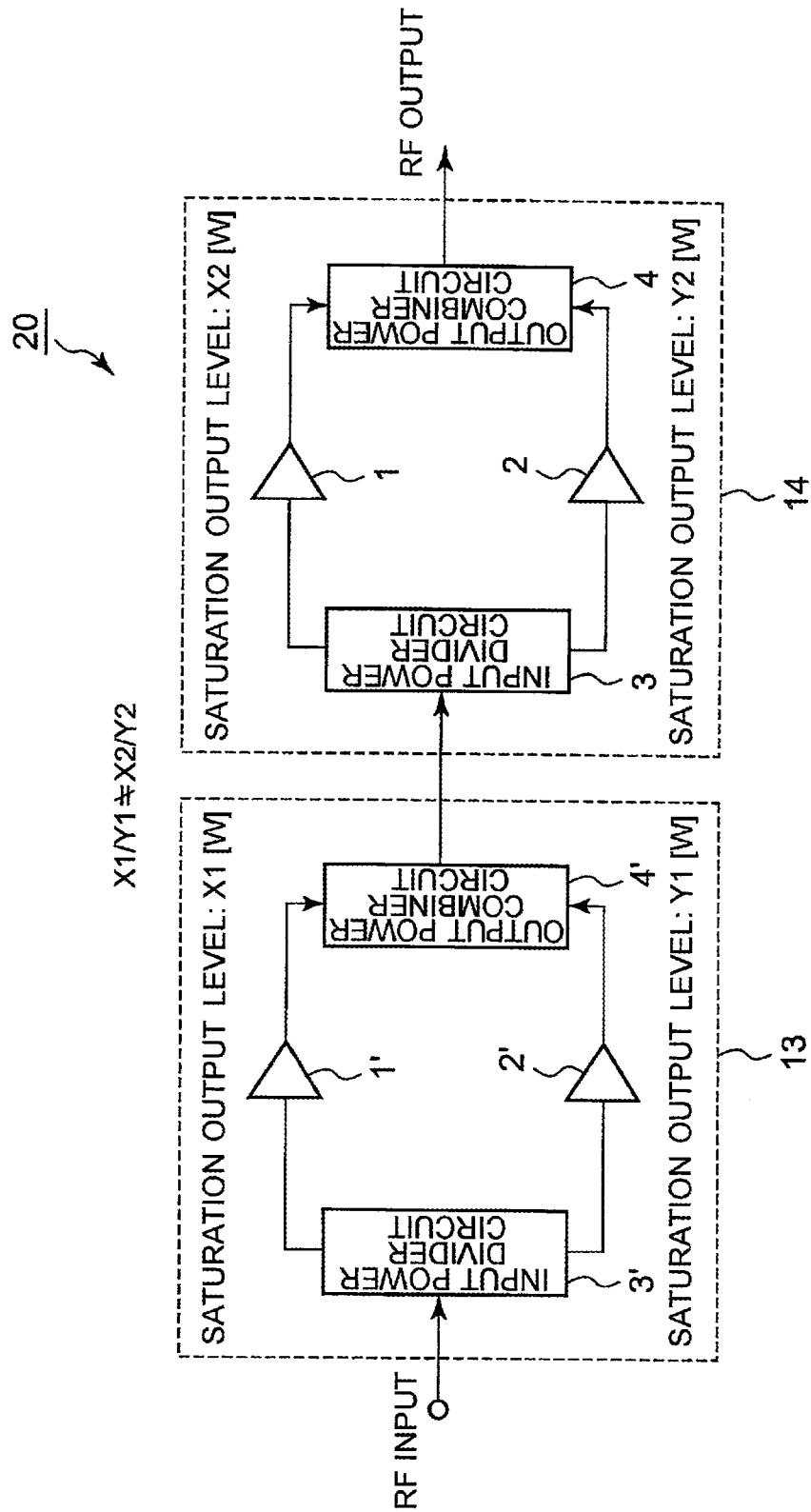
FIG. 8 is a block diagram illustrating a configuration of a power amplifier according to a first exemplary embodiment.

FIG. 8 is a block diagram illustrating a configuration of a power amplifier 20 according to a first exemplary embodiment. The power amplifier 20 according to this exemplary embodiment is a power amplifier whose transmission power varies depending on a magnitude of communication traffic and has a configuration in which a driver stage amplifier 13 and a final stage amplifier 14 are cascaded. As described before, a Doherty amplifier is employed in circuit configuration of each of the driver stage amplifier (first amplifier) 13 and the final stage amplifier (second amplifier) 14.

The driver stage amplifier (first amplifier) 13 comprises a first carrier amplifier 1', a first peak amplifier 2', a first input power divider circuit 3', and a first output power combiner circuit 4'.

Likewise, the final stage amplifier (second amplifier) 14 comprises a second carrier amplifier 1, a second peak amplifier 2, a second input power divider circuit 3, and a second output power combiner circuit 4.

The first output power combiner circuit 4' has an output terminal connected to an input terminal of the second input power divider circuit 3.

In the driver stage amplifier (first amplifier) 13, the first carrier amplifier 1' has a saturation output level of X1 [W], and the first peak amplifier 2' has a saturation output level of Y1 [W]. Accordingly, the driver stage amplifier (first amplifier) 13 has a power ratio represented by (X1/Y1).

On the other hand, in the final stage amplifier (second amplifier) 14, the second carrier amplifier 1 has a saturation output level of X2 [W], and the second peak amplifier 2 has a saturation output level of Y2 [W]. Accordingly, the final stage amplifier (second amplifier) 14 has a power ratio represented by (X2/Y2).

The power ratio (X1/Y1) of the driver stage amplifier (first amplifier) 13 is different from the power ratio (X2/Y2) of the final stage amplifier (second amplifier) 14. This means that (X1/Y1)≠(X2/Y2). In other words, the first amplifier 13 and the second amplifier 14 are formed by elements having different amplification characteristics.

Figure 1:
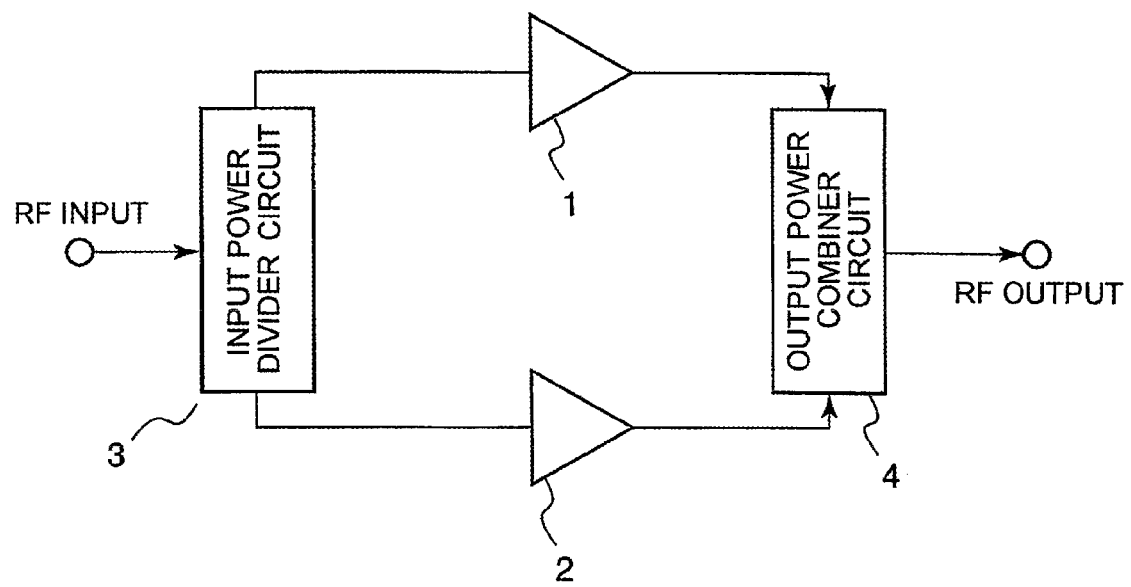
FIG. 1 is a block diagram illustrating a configuration of a typical Doherty amplifier.
Figure 2:
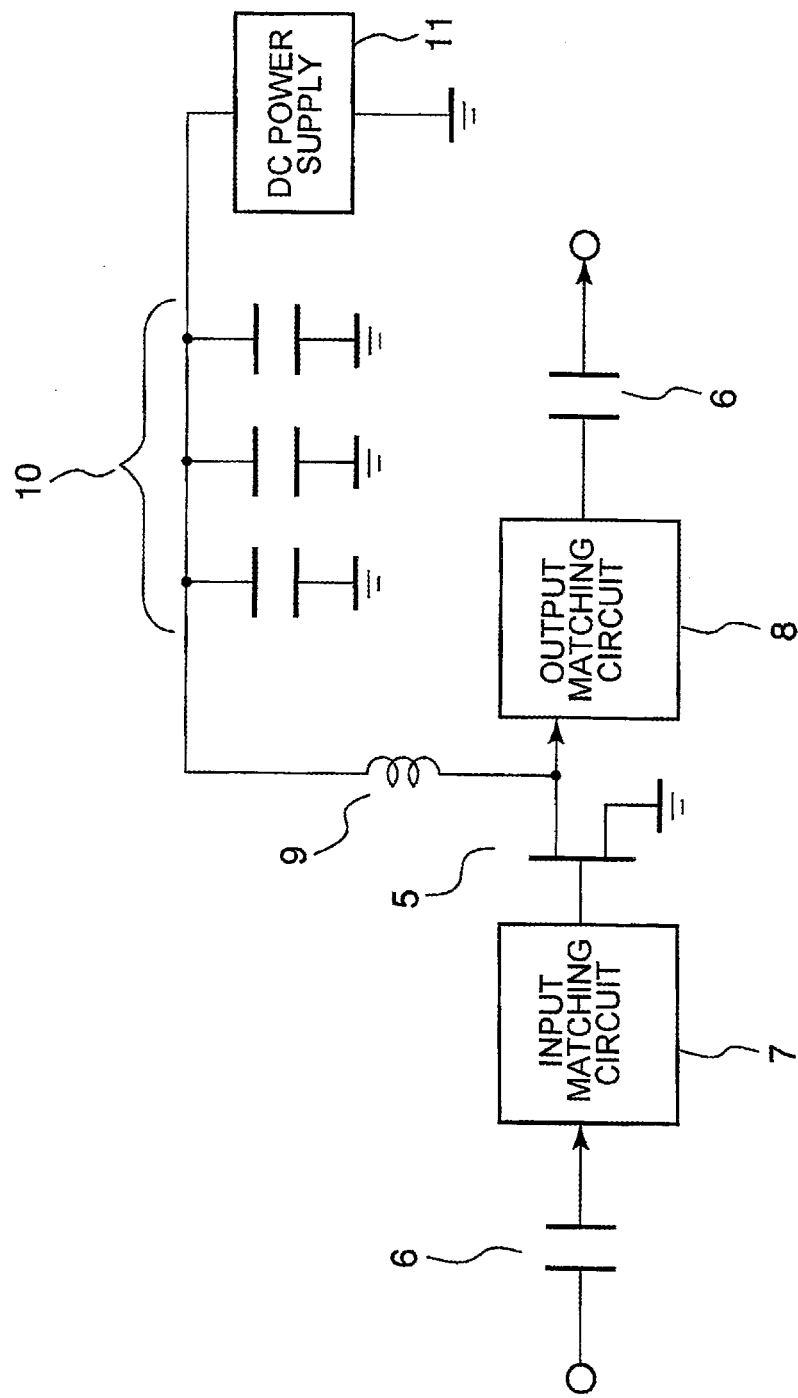
FIG. 2 is a block diagram illustrating an example of a configuration when FETs are used as a carrier amplifier and a peak amplifier in the Doherty amplifier shown in FIG. 1.

The first and second carrier amplifiers 1', 1 and the first and second peak amplifiers 2', 2 are each composed of a FET 5, a DC coupling capacitor 6, an input matching circuit 7, an output matching circuit 8, a RF choke coil 9, a by-pass capacitor 10, a DC power supply 11 and so on as in the example shown in FIG. 2. In general, the first and second carrier amplifiers 1', 1 are biased to class AB or class B, while the first and second peak amplifiers 2', 2 are biased to class C.

The description will be continued on the assumption that the power ratio (X2/Y2) of the final stage amplifier (second amplifier) 14 is substantially equal to one ((X2/Y2)=1) whereas the power ratio (X1/Y1) of the driver stage amplifier (first amplifier) 13 is not equal to one ((X1/Y1)≠1). In other words, the final stage amplifier (second amplifier) 14 is formed by a symmetric Doherty amplifier, and the driver stage amplifier (first amplifier) 13 is formed by an asymmetric Doherty amplifier.

The power ratio (X1/Y1) of the asymmetric Doherty amplifier 13 is preferably in the range of (1/5) to 5 (excluding 1 and including the values at the opposite ends). More preferably, the power ratio (X1/Y1) of the asymmetric Doherty amplifier 13 is in the range of (1/3) to 3 (excluding 1 and including the values at the opposite ends).

Next, operation of the power amplifier 20 will be described with reference to FIG. 8.

The final stage amplifier (second amplifier) 14 is configured as a well-known symmetric Doherty amplifier. The symmetric Doherty amplifier 14 comprises a second carrier amplifier 1 biased to class AB or class B, and a second peak amplifier 2 biased to class C. A RF signal supplied to the symmetric Doherty amplifier 14 is branched between the second carrier amplifier 1 and the second peak amplifier 2 by the second input power distribution circuit 3. The second carrier amplifier 1 biased to class AB or class B operates while maintaining saturation near the saturation output power. On the other hand, the second peak amplifier 2 biased to class C operates only in a state where large signal power is input.

Figure 3:
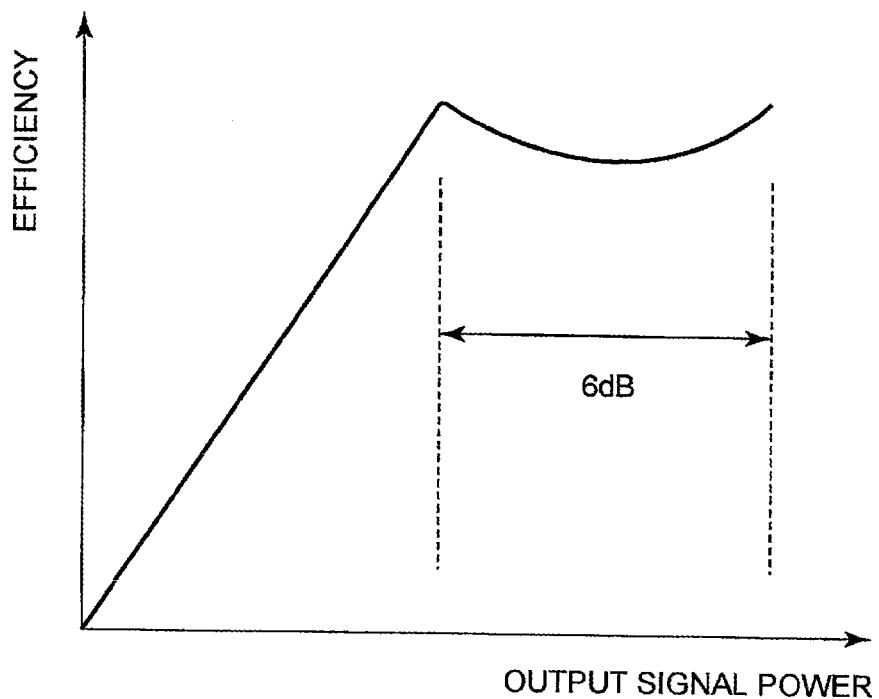
FIG. 3 is a diagram showing efficiency characteristics versus output power of a power amplifier using the Doherty amplifier configuration shown in FIG. 1.

The presence of the second carrier amplifier 1 operating while maintaining saturation near the saturation output power enables operation at higher efficiency than conventional class-A or class-AB amplifiers even during output with a back-off from the saturation output power. Efficiency characteristics against output signal power of the final stage power amplifier 14 are shown in FIG. 3. The efficiency characteristics exhibit an efficiency peak at the 6 dB back-off point (peak point on the left side (lower output power side) in FIG. 3) where the output of the second carrier amplifier 1 is saturated, with respect to the combined saturation power of the second carrier amplifier 1 and the second peak amplifier 2.

Figure 4:
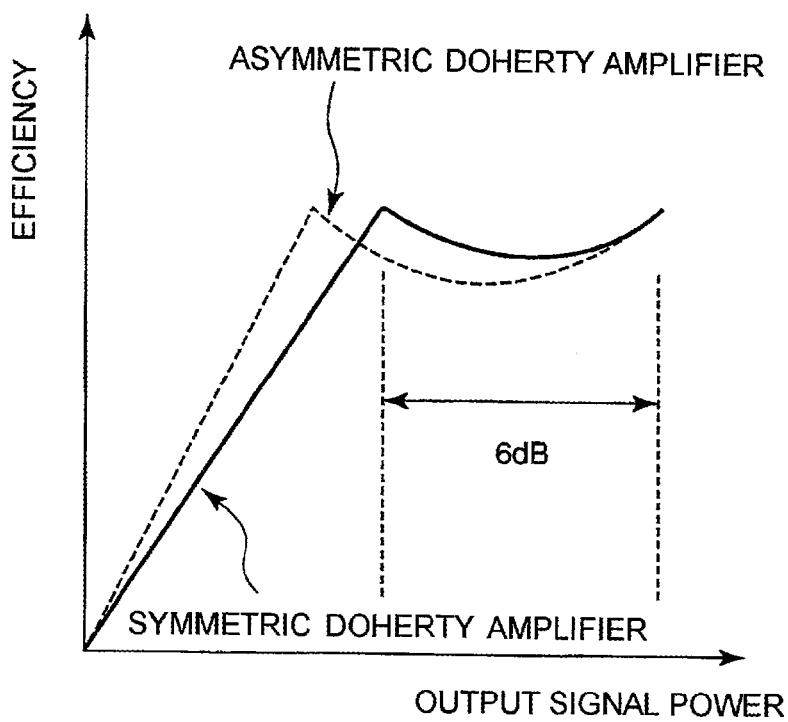
FIG. 4 is a diagram comparatively showing relationships of efficiency characteristics versus output power of a symmetric Doherty amplifier and an asymmetric Doherty amplifier.

While the driver stage amplifier 13 also comprises the first carrier amplifier 1' biased to class AB or class B, and the first peak amplifier 2' biased to class C, the first carrier amplifier 1' and the first peak amplifier 2' are formed by devices having different saturation output levels X1, Y1 (X1≠Y1). The efficiency characteristics against the output signal power of the driver stage amplifier 13 are shown in FIG. 4 as the graph for the asymmetric Doherty amplifier. The efficiency characteristics exhibit an efficiency peak at a back-off point that is different from the 6 dB back-off point (peak point on the left side (lower output power side) in FIG. 4) with respect to t the combined saturation power of the first carrier amplifier 1' and the first peak amplifier 2'.

Describing in more detail, when [the saturation output level X1 of the first carrier amplifier 1']>[the saturation output level Y1 of the first peak amplifier 2'], the driver stage amplifier 13 has its efficiency peak at a point that is backed off by less than 6 dB. In contrast, when [the saturation output level X1 of the first carrier amplifier 1']<[the saturation output level Y1 of the first peak amplifier 2'], as shown in FIG. 4, the driver stage amplifier 13 has its efficiency peak at a point backed off by more than 6 dB.

Figure 9:
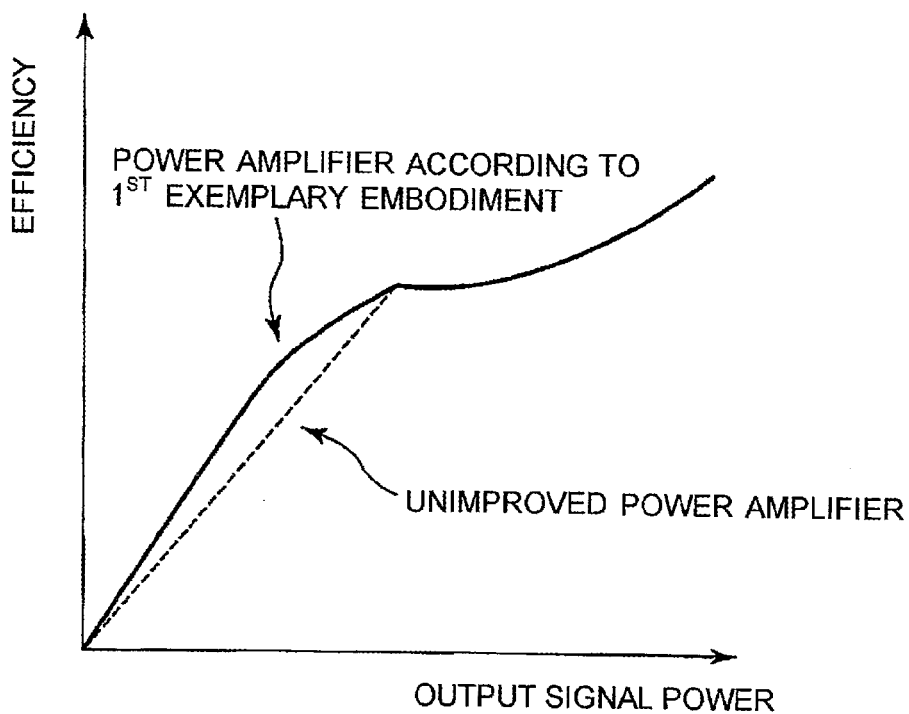
FIG. 9 is a graph plotting efficiency characteristics against output power of the unimproved power amplifier (FIG. 5) and of the power amplifier according to the first exemplary embodiment (FIG. 8)

The final stage amplifier 14 formed by a symmetric Doherty amplifier and the driver stage amplifier 13 formed by an asymmetric Doherty amplifier are cascaded, whereby the characteristic of the power amplifier 20 are such that when [the saturation output level X1 of the first carrier amplifier 1']<[the saturation output level Y1 of the first peak amplifier 2'], for example, the driver stage amplifier 13 has its efficiency peak at a point backed off by more than 6 dB (see the characteristics indicated by the dashed line in FIG. 4). Therefore, when profiles of the symmetric Doherty amplifier 14 and the asymmetric Doherty amplifier 13 are combined, as shown in FIG. 9, the efficiency is improved in a region where the output signal power is low.

Figure 5:
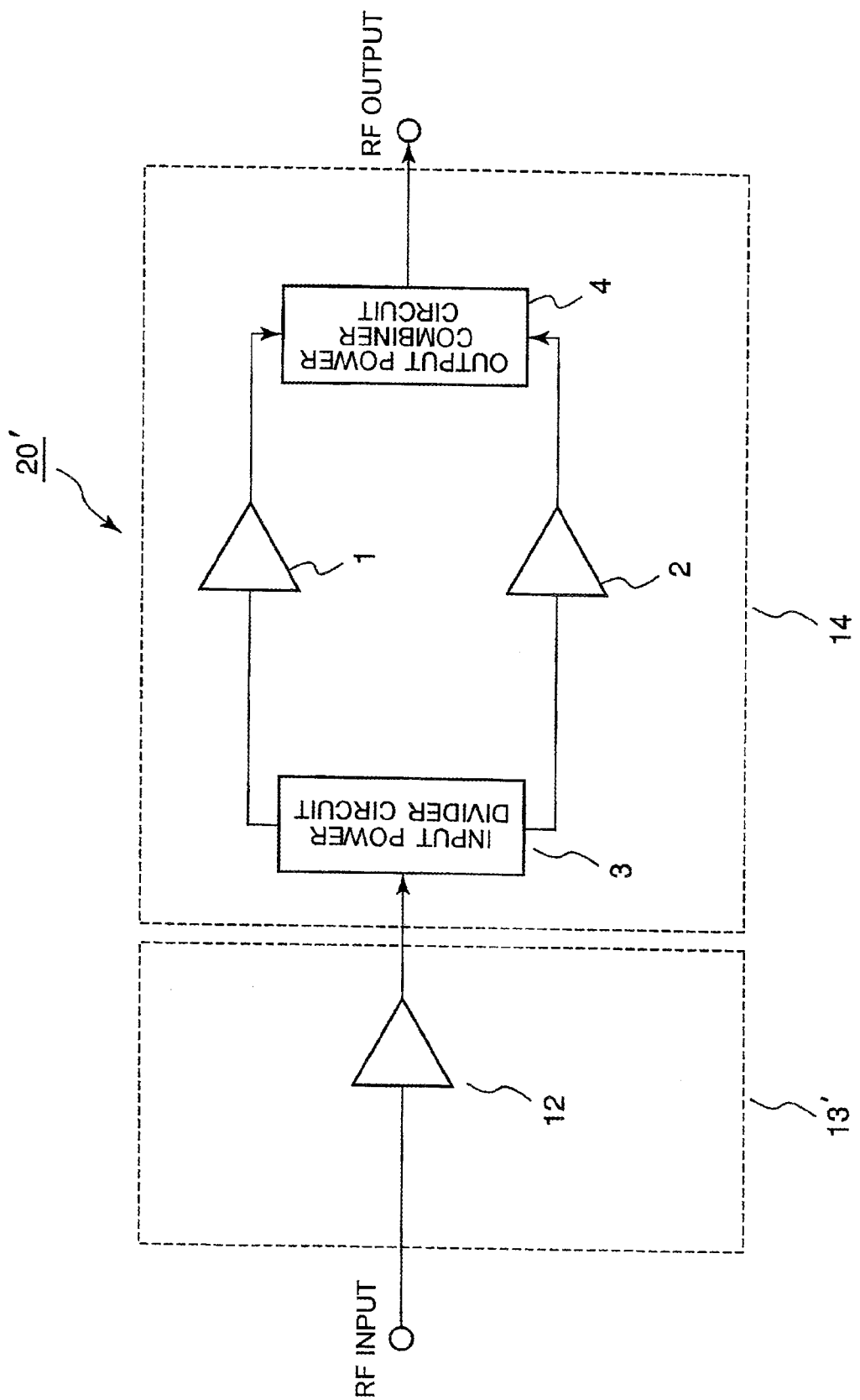
FIG. 5 is a block diagram illustrating an unimproved power amplifier in which a driver stage amplifier is cascaded to a final stage amplifier having a Doherty amplifier configuration.
Figure 6:
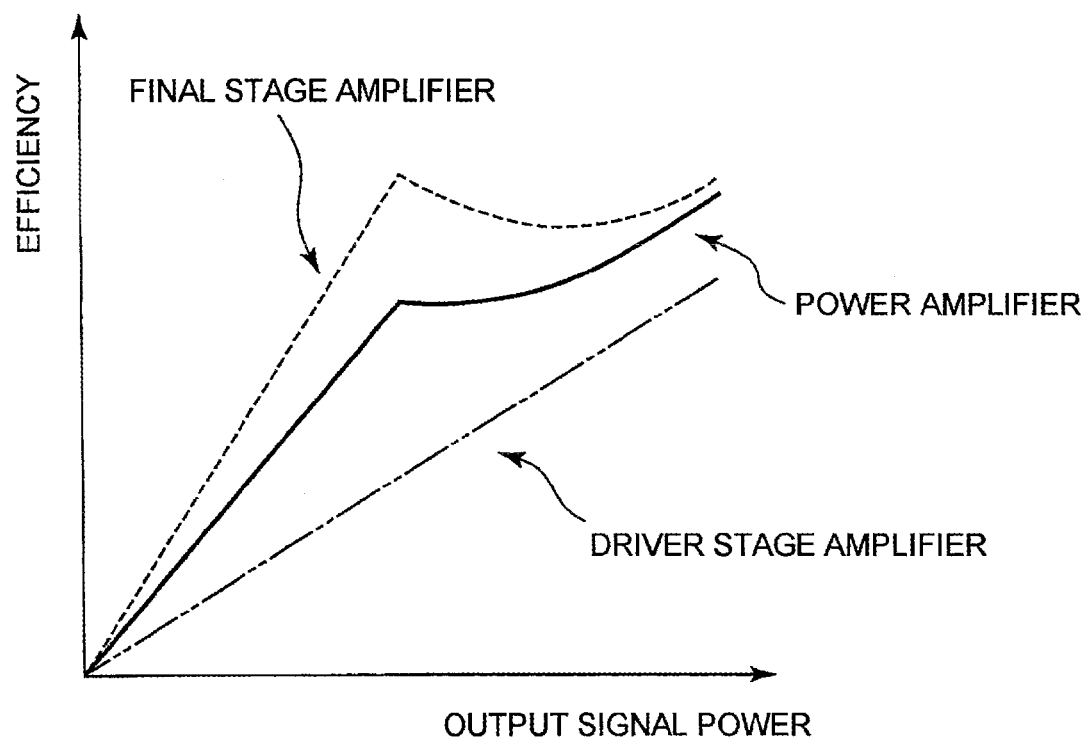
FIG. 6 is a graph plotting efficiency characteristics against output power of the driver stage amplifier, the final stage amplifier, and the power amplifier shown in FIG. 5.
Figure 7A:
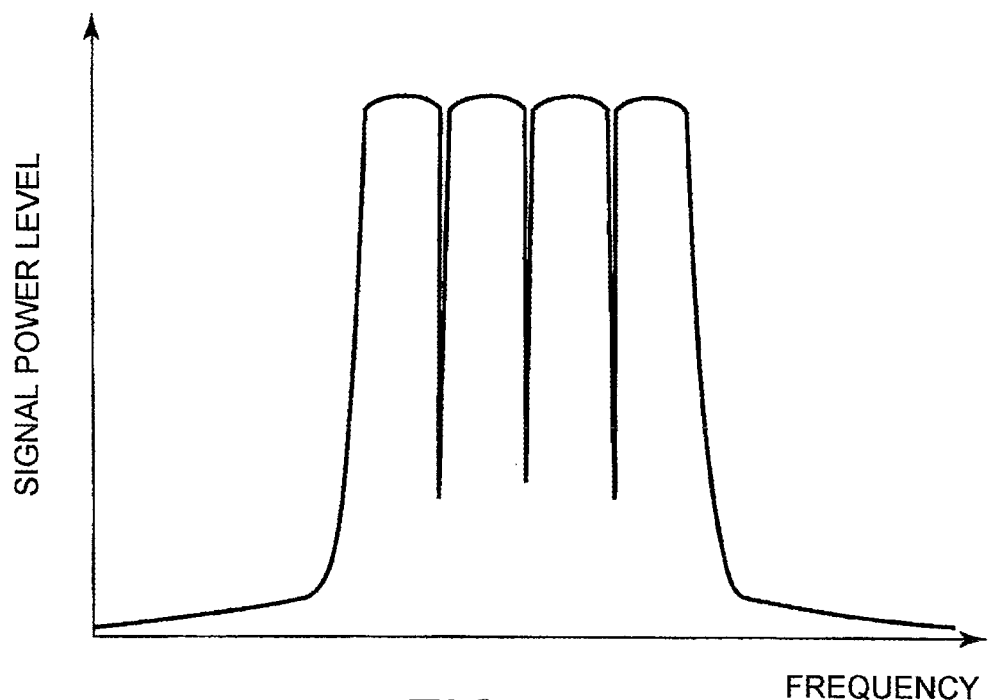
FIG. 7A and FIG. 7B are diagrams illustrating operation states of carriers in a mobile communication system such as a W-CDMA modulation wave system in which the amount of communication traffic varies depending on time and location, FIG. 7A showing a state in which the system is operated with four carriers, FIG. 7B showing a state in which the system is operated with a single carrier.
Figure 7B:
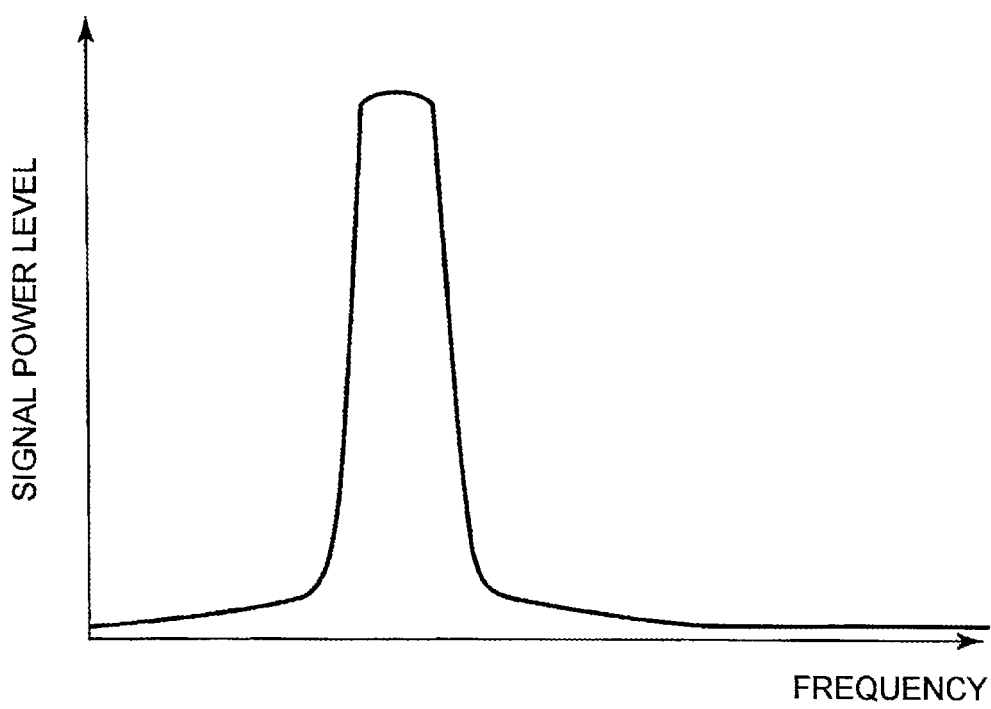

Accordingly, the power amplifier 20 is capable of improving and enhancing the efficiency characteristics in a region where the output signal power is low in comparison when the efficiency characteristics with respect to the output signal power of the unimproved power amplifier 20' (FIG. 5).

Figure 10:
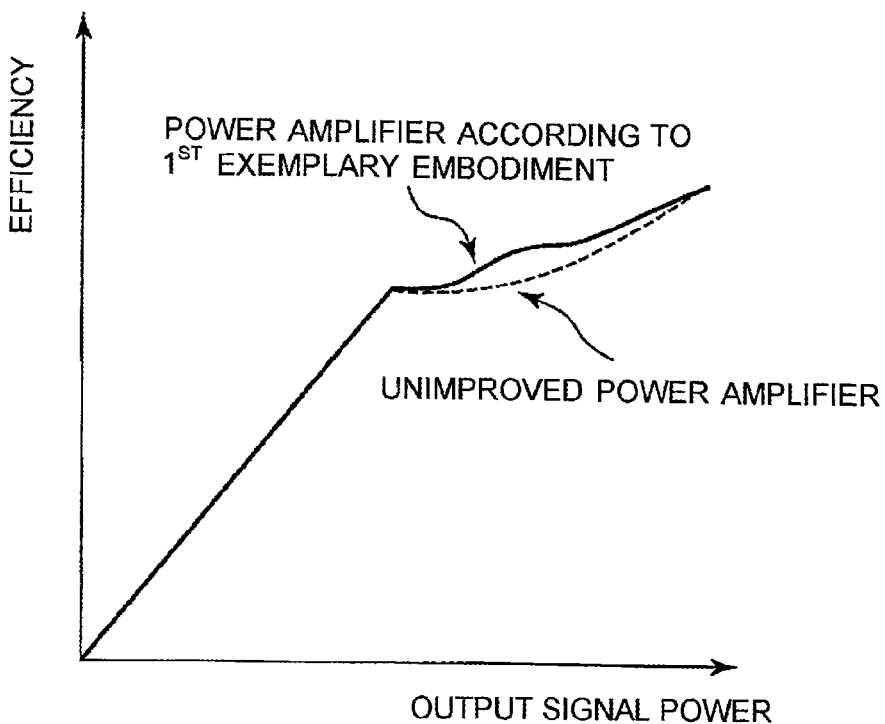
FIG. 10 is a graph plotting efficiency characteristics against output power of the unimproved power amplifier (FIG. 5) and of the power amplifier according to the first exemplary embodiment (FIG. 8)

On the contrary, when [the saturation output level X1 of the first carrier amplifier 1']>[the saturation output level Y1 of the first peak amplifier 2'], as described above, the driver stage amplifier 13 has its efficiency peak at a point backed off by less than 6 dB. Therefore, when profiles of the symmetric Doherty amplifier 14 and the asymmetric Doherty amplifier 13 are combined, the efficiency characteristics of the power amplifier 20 are improved and enhanced in a region where the output signal power is high as shown in FIG. 10.

Next, advantageous effects of the power amplifier 20 shown in FIG. 8 will be described.

A first effect resides in that the power amplifier 20 can be operated at higher efficiency than the unimproved power amplifier 20' (FIG. 5) both in a region where the transmission signal power level is high and in a region where the transmission signal power level is low, the transmission signal power level being determined based on a magnitude of amount of communication traffic or the like.

A second effect resides in that the power amplifier 20 can be operated at high efficiency even when the power amplifier 20 must be operated at an operating point that is backed off more than normal due to input of a modulation signal having a different peak factor (ratio between instantaneous maximum power level and average power level).

The first exemplary embodiment has been described on the assumption that the final stage amplifier (second amplifier) 14 is configured as a symmetric Doherty amplifier ((X2/Y2)=1). However, the configuration of the final stage amplifier is not limited to that of a symmetric Doherty amplifier, but the final stage amplifier may be configured as an asymmetric Doherty amplifier ((X2/Y2)≠1).

This means that the final stage amplifier 14 may be formed by an asymmetric Doherty amplifier ((X2/Y2)≠1), while the driver stage amplifier 13 may be formed by an asymmetric Doherty amplifier ((X1/Y1)≠1).

According to this configuration, it is preferable that when (X1/Y1) is greater than 1, (X2/Y2) is set to be smaller than 1, and when (X1/Y1) is smaller than 1, (X2/Y2) is set to be greater than 1. This is because the efficiency peak can be shifted to both the lower output side and the higher output side, and hence the efficiency characteristics can be enhanced and improved both in the region where the output signal power is low and in the region where the output signal power is high.

Instead of the aforementioned configuration, the final stage amplifier 14 may be formed by an asymmetric Doherty amplifier ((X2/Y2) 1), and the driver stage amplifier 13 may be formed by a symmetric Doherty amplifier ((X1/Y1)=1).

Although, in the first exemplary embodiment, the power amplifier 20 has been described as having a two-block configuration (N=2) consisting of the final stage amplifier (second amplifier) 14 and the driver stage amplifier (first amplifier) 13, this invention is not limited to the two-block configuration, and the power amplifier 20 can be formed by connecting three, four, or more amplifiers (N>2). In this case, an asymmetric Doherty amplifier or a symmetric Doherty amplifier is employed for each of the amplifiers while varying their power ratios so as to shift their efficiency peaks slightly from each other, whereby the range of output signal power levels enabling the power amplifier to operate at high efficiency can be further enlarged.

Figure 11:
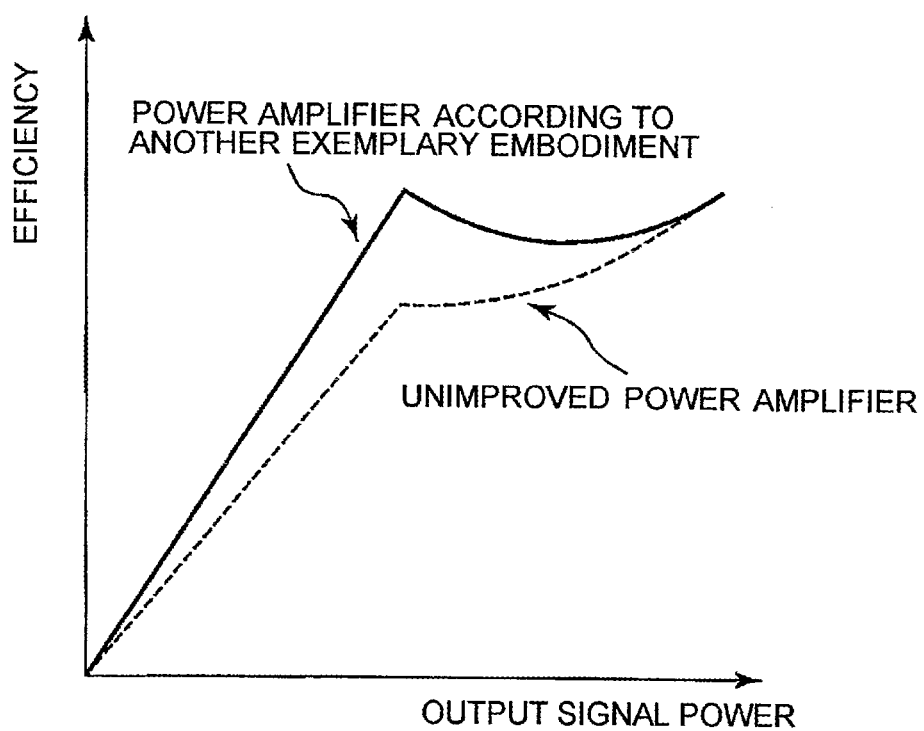
FIG. 11 is a graph plotting efficiency characteristics against output power of a power amplifier according to another exemplary embodiment in which three, four, or a plurality of Doherty amplifiers are connected.

FIG. 11 is a graph plotting the efficiency characteristics against output power in this case. The power amplifier having the efficiency characteristics shown in FIG. 11 provides an advantageous effect that operation is possible at higher efficiency than the power amplifier 20' of FIG. 5 regardless of the transmission signal power level determined based on the magnitude of the amount of communication traffic or the like.

Further, the semiconductor devices used as the carrier amplifiers 1, 1' and the peak amplifiers 2, 2' are not limited to FETs but, obviously, may be bipolar transistors. The process also may be LDMOS (Laterally Diffused Metal Oxide Semiconductor), HEMT (High Electron Mobility Transistor), HBT (Heterojunction Bipolar Transistor), or any other process. Further, the semiconductor material may be silicon, a compound semiconductor, or any other semiconductor material. The carrier amplifiers 1, 1' and the peak amplifiers 2, 2' may be formed by semiconductor device of different semiconductor materials and with different processes.

Although the method of configuration of the asymmetric Doherty amplifier has been described in terms of an example in which devices having different saturation output levels are used as the carrier amplifier and the peak amplifier, it is also possible, as described in Patent Document 3, to configure an asymmetric Doherty amplifier by using semiconductor devices having the same or different saturation output levels as the carrier amplifier and the peak amplifier, and supplying different supply voltages thereto such that the carrier amplifier and the peak amplifier have different saturation output levels.

Specifically, in the power amplifier according to the first exemplary aspect described above, the hardware configuration (circuit configuration) is used so that at least one of the first to (N−1)-th amplifiers has a different power ratio from that of the N-th amplifier. However, in a method of operating a power amplifier according to a second exemplary aspect of the invention described below, software control (operation control) is used so that at least one of the first to (N−1)-th amplifiers has a different power ratio from that of the N-th amplifier The following description of an exemplary embodiment will also be made principally in terms of an example in which N is equal to two. That is, the power amplifier comprises a first and a second amplifier which are cascaded.

Figure 12:
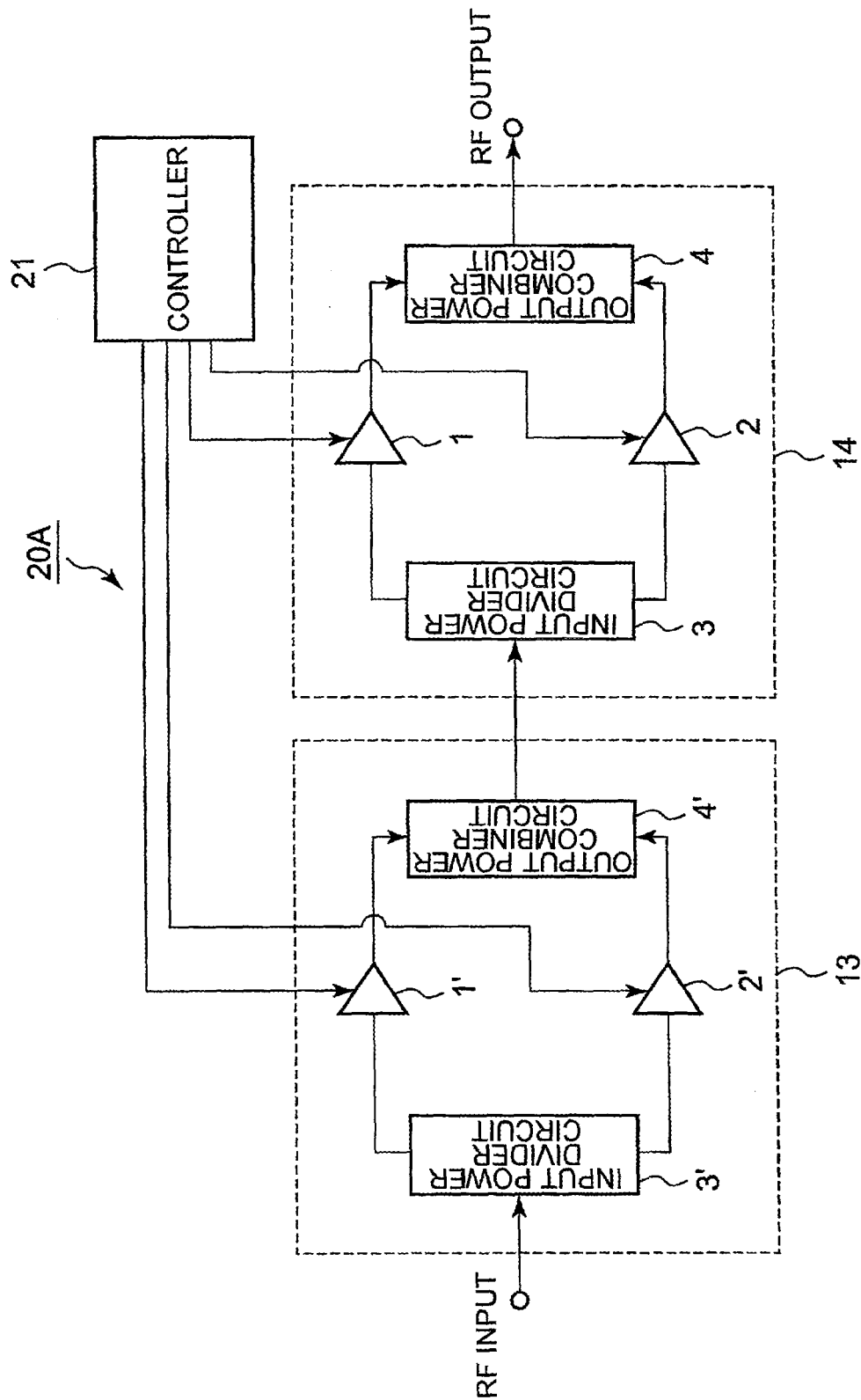
FIG. 12 is a block diagram illustrating a configuration of a power amplifier according to a second exemplary embodiment.

FIG. 12 is a block diagram illustrating a configuration of a power amplifier 20A according to a second exemplary embodiment of the invention. The illustrated power amplifier 20A here has the same configuration as the power amplifier 20 illustrated in FIG. 8 except that the power amplifier 20A further comprises a controller 21. Accordingly, components having the same functions as those shown in FIG. 8 are denoted by the same reference numerals, and redundant description will be omitted while description will be made only on different points.

In the power amplifier 20A according to this exemplary embodiment, the driver stage amplifier (first amplifier) 13 and the final stage amplifier (second amplifier) 14 have the same circuit configuration.

The controller 21 controls the power amplifier 20A such that (X1/Y1) (X2/Y2). In other words, the controller 21 controls the first amplifier 13 and the second amplifier 14 such that they have different amplification characteristics. The controller 21 controls the power amplifier 20A using one of the three control methods described below.

In a first control method, the controller 21 supplies different supply voltages to the first carrier amplifier 1', the first peak amplifier 2', the second carrier amplifier 1, and the second carrier amplifier 2, respectively.

In a second control method, the controller 21 performs temperature control such that the mounting temperature differs among the first carrier amplifier 1', the first peak amplifier 2', the second carrier amplifier 1, and the second carrier amplifier 2.

In a third control method, the controller 21 performs control of the matching circuits (see, 7, 8 in FIG. 2) such that the first carrier amplifier 1', the first peak amplifier 2', the second carrier amplifier 1, and the second carrier amplifier 2 are controlled in different manners.

According to the second exemplary embodiment as described above, the controller 21 controls the power amplifier 20A such that (X1/Y1) (X2/Y2), which makes it possible to improve and enhance the efficiency characteristics in a region where the output signal power is small and/or a region where the output signal power is large.

Although the description of the second exemplary embodiment has been made in terms of an example in which the power amplifier 20A has a two-block configuration (N=2) consisting of the final stage amplifier (second amplifier) 14 and the driver stage amplifier (first amplifier) 13, this invention is not limited to the two-block configuration, and the power amplifier 20 can be formed by connecting three, four, or more amplifiers (N>2). In this case, Doherty amplifiers having the same configuration are employed for the respective amplifiers while varying their power ratios so as to shift their efficiency peaks slightly from each other, whereby the range of output signal power levels in which the power amplifier can be operated at high efficiency can be further enlarged.

Figure 13:
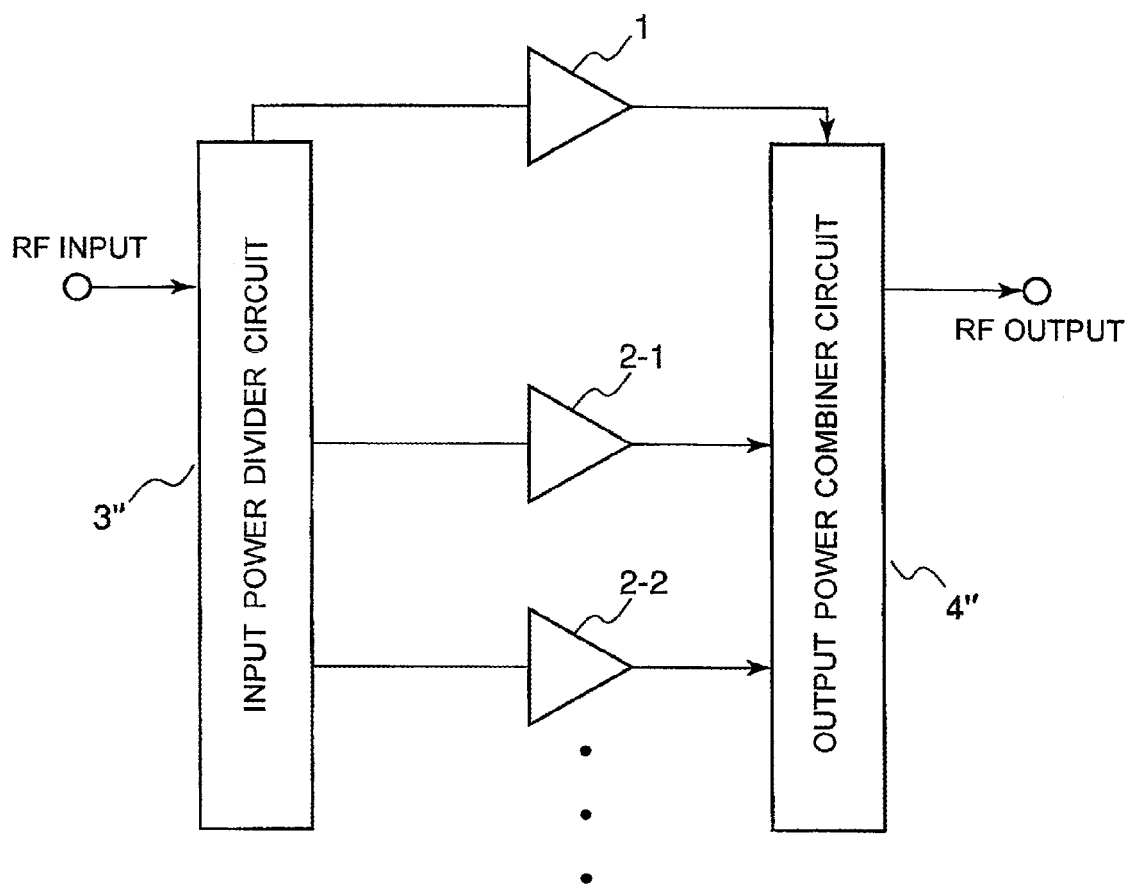
FIG. 13 is a block diagram illustrating a configuration of an N-way asymmetric Doherty amplifier having two or more peak amplifiers.

Further, the circuit configuration of the asymmetric Doherty amplifier may be that of an N-way Doherty amplifier having two more peak amplifiers 2-1, 2-2 as shown in FIG. 13.

Aspects of this invention will be described below.

A power amplifier according to a first exemplary aspect of the invention is a power amplifier for amplifying and outputting an input signal, and characterized in that: the power amplifier includes first to N-th amplifiers (N is an integer of two or more) which are cascaded; a Doherty amplifier is used in circuit configuration of each of the first to N-th amplifiers; and at least one of the first to (N−1)-th amplifiers has a different power ratio from that of the N-th amplifier.

In the power amplifier according to the first exemplary aspect, N can be equal to two. In this case, the first amplifier includes a first carrier amplifier having a saturation output level of X1 and a first peak amplifier having a saturation output level of Y1, while the second amplifier includes a second carrier amplifier having a saturation output level of X2 and a second peak amplifier having a saturation output level of Y2. When the power ratio of the first amplifier is denoted by (X1/Y1) and the power ratio of the second amplifier is denoted by (X2/Y2), (X1/Y1)≠(X2/Y2). For example, the power ratio of the first amplifier may not be equal to one while the power ratio of the second amplifier may be equal to one. Alternatively, the power ratio of the first amplifier may not be equal to one while the power ratio of the second amplifier may not be equal to one. Instead, the power ratio of the first amplifier may be equal to one while the power ratio of the second amplifier may not be equal to one.

A second exemplary aspect of the invention provides a method of operating a power amplifier for amplifying and outputting an input signal, the power amplifier includes first to N-th amplifiers (N is an integer of two or more) which are cascaded; a Doherty amplifier is used in circuit configuration of each of the first to N-th amplifiers, the method is characterized by operating the power amplifier such that at least one of the first to (N−1)-th amplifiers has a different power ratio from that of the N-th amplifier.

In the method of operating a power amplifier according to the second exemplary aspect, N may be equal to two. In this case, the first amplifier includes a first carrier amplifier having a saturation output level of X1 and a first peak amplifier having a saturation output level of Y1, while the second amplifier includes a second carrier amplifier having a saturation output level of X2 and a second peak amplifier having a saturation output level of Y2. When the power ratio of the first amplifier is denoted by (X1/Y1), and the power ratio of the second amplifier is denoted by (X2/Y2), the power amplifier operation method controls the power amplifier so that (X1/Y1)≠(X2/Y2). For example, in the power amplifier operation method, different supply voltages may be supplied to the first carrier amplifier, the first peak amplifier, the second carrier amplifier, and the second carrier amplifier. Alternatively, in the power amplifier operation method, temperature may be controlled such that the mounting temperature differs among the first carrier amplifier, the first peak amplifier, the second carrier amplifier, and the second carrier amplifier. Instead, the power amplifier operation method may control the matching circuits of the first carrier amplifier, the first peak amplifier, the second carrier amplifier, and the second carrier amplifier in different manners.

While the invention has been particularly shown and described with reference to exemplary embodiments thereof, the invention is not limited to those embodiments. It will be understood by those of ordinary skill in the art that various changes and details may be made therein without departing from the spirit and scope of the present invention as defined by the claims.

INDUSTRIAL APPLICABILITY

This invention is applicable to microwave circuits, radio communication equipment for mobile communication, mobile phone base station systems, IMT (International mobile telecommunication)-2000, HSPA (High Speed Packet Access) Evolution, LTE (Long Term Evolution), WiMAX (Worldwide Interoperability for Microwave Access), and IMT-advanced.

This application is based upon and claims the benefit of priority from Japanese Patent Application No. 2009-235926 filed Oct. 13, 2009, the disclosure of which is incorporated herein in its entirety by reference.

The invention claimed is:

1. A power amplifier for amplifying and outputting an input signal, wherein:
the power amplifier includes first and second amplifiers which are cascaded;
a Doherty amplifier is used in circuit configuration of each of the first and second amplifiers; and
the first amplifier has a different power ratio from a power ratio of the second amplifier, and wherein:
the first amplifier includes a first carrier amplifier having a saturation output level of X1 and a first peak amplifier having a saturation output level of Y1;
the second amplifier includes a second carrier amplifier having a saturation output level of X2 and a second peak amplifier having a saturation output level of Y2; and
(X1/Y1)≠(X2/Y2) when the power ratio of the first amplifier is denoted by (X1/Y1) and the power ratio of the second amplifier is denoted by (X2/Y2).

2. The power amplifier according to claim 1, wherein each of the carrier amplifiers and each of the peak amplifiers has a matching circuit, and the matching circuits are respectively controlled in different manners.

3. The power amplifier according to claim 1, wherein the power ratio of the first amplifier is not equal to one, while the power ratio of the second amplifier is equal to one.

4. The power amplifier according to claim 1, wherein the power ratio of the first amplifier is not equal to one, while the power ratio of the second amplifier is not equal to one.

5. The power amplifier according to claim 1, wherein the power ratio of the first amplifier is equal to one, while the power ratio of the second amplifier is not equal to one.

6. A method of operating a power amplifier for amplifying and outputting an input signal, wherein:
the power amplifier includes first and second amplifiers which are cascaded;
a Doherty amplifier is used in circuit configuration of each of the first and second amplifiers, wherein said method comprises:
operating the power amplifier such that the first amplifier has a different power ratio from a power ratio of the second amplifier, and wherein:
the first amplifier includes a first carrier amplifier having a saturation output level of X1 and a first peak amplifier having a saturation output level of Y1;
the second amplifier includes a second carrier amplifier having a saturation output level of X2 and a second peak amplifier having a saturation output level of Y2; wherein said method further comprises:
controlling the power amplifier such that (X1/Y1)≠(X2/Y2) when the power ratio of the first amplifier is denoted by (X1/Y1) and the power ratio of the second amplifier is denoted by (X2/Y2).

7. The method according to claim 6, wherein said method comprises supplying different supply voltages to the first carrier amplifier, the first peak amplifier, the second carrier amplifier, and the second carrier amplifier, respectively.

8. The method according to claim 6, wherein said method comprises controlling temperature such that the mounting temperature differs among the first carrier amplifier, the first peak amplifier, the second carrier amplifier, and the second carrier amplifier.

9. The method according to claim 6, wherein said method comprises controlling matching circuits of the first carrier amplifier, the first peak amplifier, the second carrier amplifier, and the second carrier amplifier in different manners, respectively.

* * * * *